United States Patent
Chen et al.

(10) Patent No.: US 10,416,373 B2
(45) Date of Patent: Sep. 17, 2019

(54) LIGHT EMITTING DIODE (LED) DEVICES

(71) Applicant: NANOSYS, INC., Milpitas, CA (US)

(72) Inventors: Jian Chen, Saratoga, CA (US); Robert S. Dubrow, San Carlos, CA (US); Steven Gensler, San Jose, CA (US); Jason Hartlove, Los Altos, CA (US); Ernest Lee, Palo Alto, CA (US); Robert Edward Wilson, Palo Alto, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 15/910,342

(22) Filed: Mar. 2, 2018

(65) Prior Publication Data

US 2018/0188445 A1    Jul. 5, 2018

Related U.S. Application Data (63) Continuation of application No. 14/515,814, filed on Oct. 16, 2014, now abandoned.

(60) Provisional application No. 61/892,027, filed on Oct. 17, 2013.

(51) Int. Cl.
| | |
|---|---|
| *F21V 8/00* | (2006.01) |
| *G02F 1/1335* | (2006.01) |
| *H01L 33/50* | (2010.01) |

(52) U.S. Cl.
CPC ........... *G02B 6/0073* (2013.01); *G02B 6/005* (2013.01); *G02F 1/133615* (2013.01); *G02F 2001/133614* (2013.01); *H01L 33/502* (2013.01)

(58) Field of Classification Search
CPC ............... G02B 6/0073; G02B 6/005; G02F 2001/133614; G02F 1/133615; H01L 33/502
See application file for complete search history.

(56) References Cited

U.S. PATENT DOCUMENTS

| | | | |
|---|---|---|---|
| 6,949,206 | B2 | 9/2005 | Whiteford et al. |
| 7,267,875 | B2 | 9/2007 | Whiteford et al. |
| 7,374,807 | B2 | 5/2008 | Parce et al. |
| 7,572,393 | B2 | 8/2009 | Whiteford et al. |
| 7,645,397 | B2 | 1/2010 | Parce et al. |
| 7,695,150 | B2 | 4/2010 | Dejima et al. |

(Continued)

FOREIGN PATENT DOCUMENTS

| | | |
|---|---|---|
| CN | 1873306 A | 12/2006 |
| CN | 1947057 A | 4/2007 |

(Continued)

OTHER PUBLICATIONS

English translation of Notification Reasons for Rejection for Japanese Patent Appl. No. 2016-521939, 8 pages, dated May 24, 2018.

(Continued)

*Primary Examiner* — Anh T Mai
*Assistant Examiner* — Glenn D Zimmerman
(74) *Attorney, Agent, or Firm* — Sterne, Kessler, Goldstein & Fox P.L.L.C.

(57) ABSTRACT

Disclosed herein are display systems comprising light-emitting, diodes (LEDs), suitably blue light LEDs, which demonstrate increased optical power output. In embodiments, the display systems include compositions comprising phosphors, including luminescent nanocrystals.

17 Claims, 5 Drawing Sheets

(56) References Cited

U.S. PATENT DOCUMENTS

| | | |
|---|---|---|
| 7,830,472 B2 | 11/2010 | Kawana et al. |
| 7,891,852 B2 | 2/2011 | Pugh et al. |
| 8,210,701 B2 | 7/2012 | Igarashi et al. |
| 8,283,412 B2 | 10/2012 | Liu et al. |
| 8,563,133 B2 | 10/2013 | Whiteford et al. |
| 9,146,350 B2 | 9/2015 | Natsumeda |
| 9,199,842 B2 | 12/2015 | Dubrow et al. |
| 9,512,979 B2 | 12/2016 | Hirosaki et al. |
| 9,946,004 B2 * | 4/2018 | Coe-Sullivan ......... G02B 6/005 |
| 2005/0254258 A1 * | 11/2005 | Lee ....................... G02B 6/0025 362/612 |
| 2006/0255711 A1 | 11/2006 | Dejima et al. |
| 2006/0268568 A1 | 11/2006 | Oku et al. |
| 2007/0041186 A1 | 2/2007 | Tan et al. |
| 2007/0081329 A1 | 4/2007 | Chua et al. |
| 2007/0081360 A1 * | 4/2007 | Bailey ................... G02B 6/0021 362/621 |
| 2007/0086184 A1 | 4/2007 | Pugh et al. |
| 2008/0212305 A1 | 9/2008 | Shin et al. |
| 2008/0237540 A1 | 10/2008 | Dubrow |
| 2008/0296596 A1 * | 12/2008 | Setlur .................... B82Y 30/00 257/98 |
| 2009/0016080 A1 | 1/2009 | Ohno |
| 2010/0085727 A1 | 4/2010 | Igarashi et al. |
| 2010/0110728 A1 | 5/2010 | Dubrow et al. |
| 2010/0283072 A1 | 11/2010 | Kazlas et al. |
| 2011/0051459 A1 | 3/2011 | Douglas et al. |
| 2011/0180824 A1 | 7/2011 | Tan et al. |
| 2011/0241028 A1 | 10/2011 | Park et al. |
| 2011/0309398 A1 | 12/2011 | Ito et al. |
| 2012/0113672 A1 | 5/2012 | Dubrow et al. |
| 2012/0176766 A1 | 7/2012 | Natsumeda |
| 2012/0257143 A1 | 10/2012 | Whitehead |
| 2013/0114301 A1 | 5/2013 | Um |
| 2013/0148057 A1 | 6/2013 | Kang et al. |
| 2013/0181603 A1 | 7/2013 | Dubrow et al. |
| 2013/0242600 A1 | 9/2013 | Franklin et al. |
| 2013/0278612 A1 | 10/2013 | Holman et al. |
| 2013/0335677 A1 * | 12/2013 | You ................... G02F 1/133609 349/65 |
| 2014/0071381 A1 | 3/2014 | Jang et al. |
| 2014/0204575 A1 | 7/2014 | Jo et al. |
| 2014/0248458 A1 | 9/2014 | Sherman et al. |
| 2014/0307415 A1 | 10/2014 | Naoto et al. |
| 2015/0009686 A1 | 1/2015 | Pumyea et al. |
| 2015/0050432 A1 | 2/2015 | Ooga et al. |
| 2015/0109814 A1 | 4/2015 | Chen et al. |

FOREIGN PATENT DOCUMENTS

| | | |
|---|---|---|
| CN | 101718409 A | 6/2010 |
| CN | 102549328 A | 7/2012 |
| CN | 103228983 A | 7/2013 |
| CN | 103347980 A | 10/2013 |
| CN | 101292183 A | 10/2018 |
| EP | 1742096 A1 | 1/2007 |
| EP | 2671939 A1 | 12/2013 |
| JP | H09-050704 A | 2/1997 |
| JP | H11-053919 A | 2/1999 |
| JP | 2005-38755 A | 2/2005 |
| JP | 2005-276586 A | 10/2005 |
| JP | 2006-047975 A | 2/2006 |
| JP | 2006-277991 A | 10/2006 |
| JP | 2008-123969 A | 5/2008 |
| JP | 2010-092705 A | 4/2010 |
| JP | 2012-162632 A | 8/2012 |
| JP | 2012-204071 A | 10/2012 |
| JP | 2013-015865 A | 1/2013 |
| JP | 2013-157165 A | 8/2013 |
| JP | 2013-171631 A | 9/2013 |
| JP | 2013-182918 A | 9/2013 |
| JP | 2013-544018 A | 12/2013 |
| WO | WO 2005/111707 A1 | 11/2005 |
| WO | WO 2007/046035 A1 | 4/2007 |
| WO | WO 2012/064562 A1 | 5/2012 |
| WO | WO 2012/105687 A1 | 8/2012 |
| WO | WO 2012/128384 A1 | 9/2012 |

OTHER PUBLICATIONS

English translation of Notification of the First Office Action for Chinese Patent Appl. No. 201480064542.3, 13 pages, dated Jul. 2, 2018.

English translation of Notification of the Second Office Action for Chinese Patent Appl. No. 201480064542.3, 22 pages, dated Mar. 18, 2019.

English translation of Notification of Extended Search Report for Japanese Patent Appl No. 2016-521939, 13 pages, dated May 17 2018.

English translation of Notification Reasons for Rejection for Japanese Patent Appl. No. 2016-521939, 6 pages, dated Jan. 18, 2019.

* cited by examiner

LIGHT EMITTING DIODE (LED) DEVICES

CROSS-REFERENCE TO RELATED APPLICATIONS

The present application is a continuation application of U.S. patent application Ser. No. 14/515,814 filed Oct. 16, 2014, which claims the benefit of U.S. Provisional Patent Application No. 61/892,027, filed Oct. 17, 2013, the disclosures of which are incorporated by reference herein in their entirety.

BACKGROUND OF THE INVENTION

Field of the Invention

The present invention relates to display systems comprising light-emitting diodes (LEDs), suitably blue light LEDs, which demonstrate increased optical power output. In embodiments, the display systems include compositions comprising phosphors, including luminescent nanocrystals.

Background of the Invention

In liquid crystal display (LCD) backlights, white LEDs are typically utilized as a light source. In one configuration, the LEDs are arranged around the edge or perimeter of the display. In such the case of edge-lit backlights, light emanating from the LEDs enters a light guide, plate which distributes white light uniformly across the display. White LED package designs have been optimized to enable high extraction efficiency and coupling efficiency into the light guide plate.

LCD backlights often utilize phosphors, such as YAG phosphors. Traditionally, these phosphors have been situated inside the LED package itself. Luminescent nanocrystals represent a new, alternative class of phosphors often, used in remote-phosphor configurations where the phosphor is no longer inside the LED package. For example, luminescent nanocrystals can be embedded in a flexible film/sheet that is placed above a light guide plate (see, e.g., Published U.S. Patent Application Nos. 2010/0110728 and 2012/0113672, the disclosures of each of which are incorporated by reference herein in their entireties). In other examples, luminescent nanocrystals are encapsulated in a container, for example a capillary, which is placed between the LEDs and the light guide plate (see, e.g., Published U.S. Patent Application No 2010/0110728).

Blue LED light extraction efficiency and coupling efficiency into the light guide plate play a critical role in the overall display efficiency. Blue light extraction efficiency is poor in current blue LED designs. This is most likely a result of the reflection from the encapsulation-polymer/air interface. A significant amount of the blue light is reflected from this interface back toward the blue die of the LED, which in turn absorbs the blue light.

Disclosed herein are embodiments that overcome this deficiency with blue LED-based display devices, thereby increasing the optical power output of such devices.

SUMMARY OF PREFERRED EMBODIMENTS

In embodiments, the present application provides display systems, suitably comprising one or more blue light emitting diode(s) (LED), a light guide plate, optically coupled to the blue LED, a display and a composition comprising a plurality of phosphors, the composition oriented between the light guide plate and the display. Suitably, the display system exhibits increased optical power output as compared to a display system where the light guide plate is not optically coupled to the blue LED.

In embodiments, the light guide plate is optically coupled to the blue LED with a tape or an adhesive. In embodiments, the light guide plate is optically coupled to the blue LED via an encapsulant protruding from the LED.

Suitably, the phosphors are YAG phosphors, silicate phosphors, garnet phosphors, aluminate phosphors, nitride phosphors, NYAG phosphors, SiAlON phosphors and CASN phosphors. In further embodiments, the phosphors are luminescent nanocrystals, for example luminescent nanocrystals comprising CdSe or ZnS, including for example, luminescent nanocrystals comprising CdSe/ZnS, InP/ZnS, InP/ZnSe, PbSe/PbS, CdSe/CdS, CdTe/CdS or CdTe/ZnS.

In exemplary embodiments, the composition is a film.

Suitably, the display is a liquid crystal module.

In additional embodiments, the systems further comprise one or more of a diffuser, one or more brightness enhancement films (BEFs) and a reflector.

In embodiments, the display systems suitably exhibit at least a 10% increase in optical power output as compared to a display system where the light guide plate is not optically coupled to the blue LED.

Also provided are display systems, suitably comprising one or more blue light emitting diode(s) (LED) a light guide plate, optically coupled to the blue LED a display and a film comprising a plurality of phosphors, the composition oriented between the light guide plate and the display. Suitably, the display system exhibits at least a 10% increase in optical power output as compared to a display system where the light guide plate is not optically coupled to the blue LED.

Exemplary methods for optical coupling are described herein, as are suitable phosphors, including luminescent nanocrystals.

Also provided are display systems, suitably comprising one or more blue light emitting diode(s) (LED), a light guide plate, optically coupled to the blue LED, a polymeric film comprising a plurality of phosphors, the polymeric film oriented above the light guide plate, one or more brightness enhancement films (BEFs) oriented above the polymeric film, a top diffuser oriented above the BEFs and a liquid crystal module oriented above the top diffuser. Suitably, the display systems exhibit at least a 10% increase in optical power output as compared to a display system where the light guide plate is not optically coupled to the blue LED.

Exemplary methods for optical coupling are described herein, as are suitable phosphors, including luminescent nanocrystals.

Also provided are methods of increasing the optical power output of a blue LED in a display system, comprising optically coupling the blue LED to a light guide plate of the display system.

In embodiments of the methods, the optical coupling comprises coupling the blue LED to the light guide plate with tape or an adhesive. In embodiments of the methods, the light guide plate is optically coupled to the blue LED via an encapsulant protruding from the LED.

Suitably, the methods increase the optical power output of the blue LED by at least 10% as compared to a display system that does not comprise the blue LED optically coupled to the light guide.

Further embodiments, features, and advantages of the embodiments, as well as the structure and operation of the various embodiments, are described in detail below with reference to accompanying drawings.

DETAILED DESCRIPTION OF PREFERRED EMBODIMENTS

It should be appreciated that the particular implementations shown and described herein are examples and are not intended to otherwise limit the scope of the application in any way.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

As used in this specification, the singular forms "a," "an" and "the" specifically also encompass the plural forms of the terms to which they refer, unless the content clearly dictates otherwise. The term "about" is used herein to mean approximately, in the region of, roughly, or around. When referring to any numerical value, "about" means a value of +/−10% of the stated value (e.g. "about 100 nm" encompasses a range of sizes from 90 nm to 110 nm, inclusive).

Technical and scientific terms used herein have the meaning commonly understood by one of skill in the art to which the present application pertains, unless otherwise defined. Reference is made herein to various methodologies and materials known to those of skill in the art.

Luminescent Nanocrystal Phosphors

Described herein are various compositions comprising nanocrystals, including luminescent nanocrystals. The various properties of the luminescent nanocrystals, including their absorption properties, emission properties and refractive index properties, can be tailored and adjusted for various applications. As used herein, the term "nanocrystal" refers to nanostructures that are substantially monocrystalline. A nanocrystal has at least one region or characteristic dimension with a dimension of less than about 500 nm, and down to on the order of less than about 1 nm. The terms "nanocrystal," "nanodot," "dot," "quantum dot" and "QD" are readily understood by the ordinarily skilled artisan to represent like structures and are used herein interchangeably. The present invention also encompasses the use of polycrystalline or amorphous nanocrystals. As used herein, the term "nanocrystal" also encompasses "luminescent nanocrystals." As used herein, the term "luminescent nanocrystals" means nanocrystals that emit light when excited by an external energy source (suitably light).

The material properties of nanocrystals can be substantially homogenous, or in certain embodiments, can be heterogeneous. The optical properties of nanocrystals can be determined by their particle size, chemical or surface composition. The ability to tailor the luminescent nanocrystal size in the range between about 1 nm and about 15 nm enables photoemission coverage in the entire optical spectrum to offer great versatility in color rendering. Particle encapsulation offers robustness against chemical and UV deteriorating agents.

Nanocrystals, including luminescent nanocrystals, for use in embodiments described herein can be produced using any method known to those skilled in the art. Suitable methods and exemplary nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jan. 8, 2004, the disclosures of each of which are incorporated by reference herein in their entireties.

Luminescent nanocrystals for use in embodiments described herein can be produced from any suitable material, including an inorganic material, and more suitably an inorganic conductive or semiconductive material. Suitable semiconductor materials include those disclosed in U.S. patent application Ser. No. 10/796,832, and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3$, $N_4$, $Al_2O_3$, $(Al, Ga, In)_2$ $(S, Se, Te)_3$, $Al_2CO$, and an appropriate combination of two or more such semiconductors.

In certain embodiments, the nanocrystals may comprise a dopant from the group consisting of a p-type dopant or an n-type dopant. The nanocrystals useful herein, can also comprise II-VI or III-V semiconductors. Examples of II-VI or III-V semiconductor nanocrystals include any combination of an element from Group II, such as Zn, Cd and Hg, with any element from Group VI such as S, Se, Te and Po, of the Periodic Table; and any combination of an element from Group III, such as B, Al, Ga, In, and Tl, with any element from Group V, such as N, P, As, Sb. and Bi, of the Periodic Table.

The nancrystals, including luminescent nanocrystals, useful in embodiments described herein can also further comprise ligands conjugated, cooperated, associated or attached to their surface. Suitable ligands include any group known to those skilled in the art, including those disclosed in U.S. patent application Ser. No. 12/79,813, filed Feb. 4, 2000; U.S. patent application Ser. No. 12/076,530, filed Mar. 19, 2008. U.S. patent application Ser. No. 12/609,736, filed. Oct. 30, 2009; U.S. patent application Ser. No. 11/299,299, filed Dec. 9, 2005; U.S. Pat. Nos. 7,645,397; 7,374,807; 6,949,206; 7,572,393; and 7,267,875, the disclosures of each of which are incorporated herein by reference. Use of such ligands can enhance the ability of the nanocrystals to incorporate into various solvents and matrixes, including polymers. Increasing the miscibility (i.e., the ability to be mixed without separation) of the nanocrystals in various solvents and matrixes allows them to be distributed throughout a polymeric composition such that the nanocrystals do not aggregate together and therefore do not scatter light. Such ligands are described as "miscibility-enhancing" ligands herein.

In certain embodiments, compositions comprising nanocrystals distributed or embedded in a matrix material are provided. Suitable matrix materials can be any material known to the ordinarily skilled artisan, including polymeric materials, organic and inorganic oxides. Compositions described herein can be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting nanocrystals (for example, as disclosed in U.S. Pat. No. 7,374,807) utilize the emission properties of luminescent nanocrystals that are tailored to absorb light of a particular wavelength and then emit at a second wavelength, thereby providing enhanced performance and efficiency of active sources (e.g., LEDs).

While any method known to the ordinarily skilled artisan can be used to create nanocrystals (luminescent nanocrystals), suitably, a solution-phase colloidal method for controlled growth of inorganic nanomaterial phosphors is used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi "Synthesis and characterization of nearly monodisperse CdE (E=sulfur, selenium, tellurium) semiconductor nanocrystallites" *J. Am. Chem. Soc.* 115: 8706 (1993), the disclosures of which are incorporated by reference herein in their entireties. This manufacturing process technology leverages low cost processability without the need for clean rooms and expensive manufacturing equipment. In these methods, metal precursors that undergo pyrolysis at high temperature are rapidly injected into a hot solution of organic surfactant molecules. These precursors break apart at elevated temperatures and react to nucleate nanocrystals. After this initial nucleation phase, a growth phase begins by the addition of monomers to the growing crystal. The result is freestanding crystalline nanoparticles in solution that have an organic surfactant molecule coating their surface.

Utilizing this approach, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

In suitable embodiments, CdSe is used as the nanocrystal material, in one example, for visible light down-conversion, due to the relative maturity of the synthesis of this material. Due to the use of a generic surface chemistry, it is also possible to substitute non-cadmium-containing nanocrystals.

Core/Shell Luminescent Nanocrystals

In semiconductor nanocrystals, photo-induced emission arises from the band edge states of the nanocrystal. The band-edge emission from luminescent nanocrystals competes with radiative and non-radiative decay channels originating from surface electronic states. X. Peng, et al., *J. Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states is to epitaxially grow an inorganic shell material on the surface of the nanocrystal. X. Peng, et al., *J. Am. Chem. Soc.* 30:7019-7029 (1997). The shell material can be chosen such that the electronic levels are type 1 with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation event followed by growth, the cores act as the nuclei, and the shells grow from their surface. The temperature of the reaction is kept low to favor the addition of shell material monomers to the core surface, while preventing independent nueleation of nanocrystals of the shell materials. Surfactants in the reaction mixture are present to direct the controlled growth of shell material and to ensure solubility. A uniform and epetaxially grown shell is obtained when there is a low lattice mismatch between the two materials.

Exemplary materials for preparing core-shell luminescent nanocrystals include, but are not limited to, Si, Ge, Sn, Se, Te, B, C (including diamond), P, Co, Au, BN, BP, BAs, AlN, AlP, AlAs, AlSb, GaN, GaP, GsAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, Pb Se, PbTe, CuF, CuCl, CuBr, CuI, $Si_3N_4$, $Ge_3N_4$, $Al_2O_3$, $(Al, Ga, In)_2 (S, Se, Te)_3$, AlCO, and an appropriate combination of two or more such materials. Exemplary core-shell luminescent nanocrystals for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

As used throughout, a plurality of phosphors or a plurality of luminescent nanocrystals means more than one phosphor or luminescent nanocrystal (i.e., 2, 3, 4, 5, 10, 100, 1,000, 1,000,000, etc., nanocrystals). The compositions will suitably comprise phosphors or luminescent nanocrystals having the same composition, though in further embodiments, the plurality of phosphors or luminescent nanocrystals can be various different compositions. For example, the luminescent nanocrystals can all emit at the same wavelength, or in further embodiments, the compositions can comprise luminescent nanocrystals that emit at different wavelengths.

Luminescent nanocrystals for use in the embodiments described herein will suitably be less than about 100 nm in size, and down to less than about 2 nm in size. In suitable embodiments, the luminescent nanocrystals of the present invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. As used herein, blue light comprises light between about 435 nm and about 500 nm, green light comprises light between about 520 nm and 565 nm and red light comprises light between about 625 nm and about 740 nm in wavelength.

In embodiments, the luminescent nanocrystals have a size and a composition such that they absorb photons that are in the ultraviolet, near-infrared, and/or infrared spectra. As used herein, the ultraviolet spectrum comprises light between about 100 nm to about 400 nm, the near-infrared spectrum comprises light between about 750 nm to about 100 µm in wavelength and the infrared spectrum comprises light between about 750 nm to about 300 µm in wavelength.

While luminescent nanocrystals of any suitable material can be used in the various embodiments described herein, in certain embodiments, the nanocrystals can be ZnS, InAs or CdSe nanocrystals, or the nanocrystals can comprise various combinations to form a population of nanocrystals for use in the practice of the present invention. As discussed above, in further embodiments, the luminescent nanocrystals are core/shell nanocrystals, such as CdSe/ZnS, InP/ZnSe, CdSe/CdS or InP/ZnS.

In embodiments, the luminescent nanocrystals will include at least one population of luminescent nanocrystals capable of emitting red light and at least one population of luminescent nanocrystals capable of emitting green light upon excitation by a blue light source. The luminescent nanocrystal wavelengths and concentrations can be adjusted to meet the optical performance required. In still other embodiments, the luminescent nanocrystals phosphor material can comprise a population of luminescent nanocrystals which absorb wavelengths of light having undesirable emission wavelengths, and reemit secondary light having a desirable emission wavelength. In this manner, the luminescent nanocrystal films described herein comprise at least one population of color-filtering luminescent nanocrystals to further tune the lighting device emission and to reduce or eliminate the need for color filtering.

Suitable luminescent nanocrystals, methods of preparing luminescent nanocrystals, including the addition of various solubility-enhancing ligands, can be found in Published U.S. Patent Application No. 2012/0113672, the disclosure of which is incorporated by reference herein in its entirety.

Display Systems

In embodiments, various display systems are provided herein that are suitably used in any number of applications. As used herein, a "display system" refers an arrangement of elements that allow for the visible representation of data on a display. Suitable displays include various flat, curved or otherwise-shaped screens, films, sheets or other structures for displaying information visually to a user. Display systems described herein can be included in, for example, devices encompassing a liquid crystal display (LCD), televisions, computers, mobile phones, smart phones, personal digital assistants (PDAs), gaming devices, electronic reading devices, digital cameras, and the like.

Figure 1A:
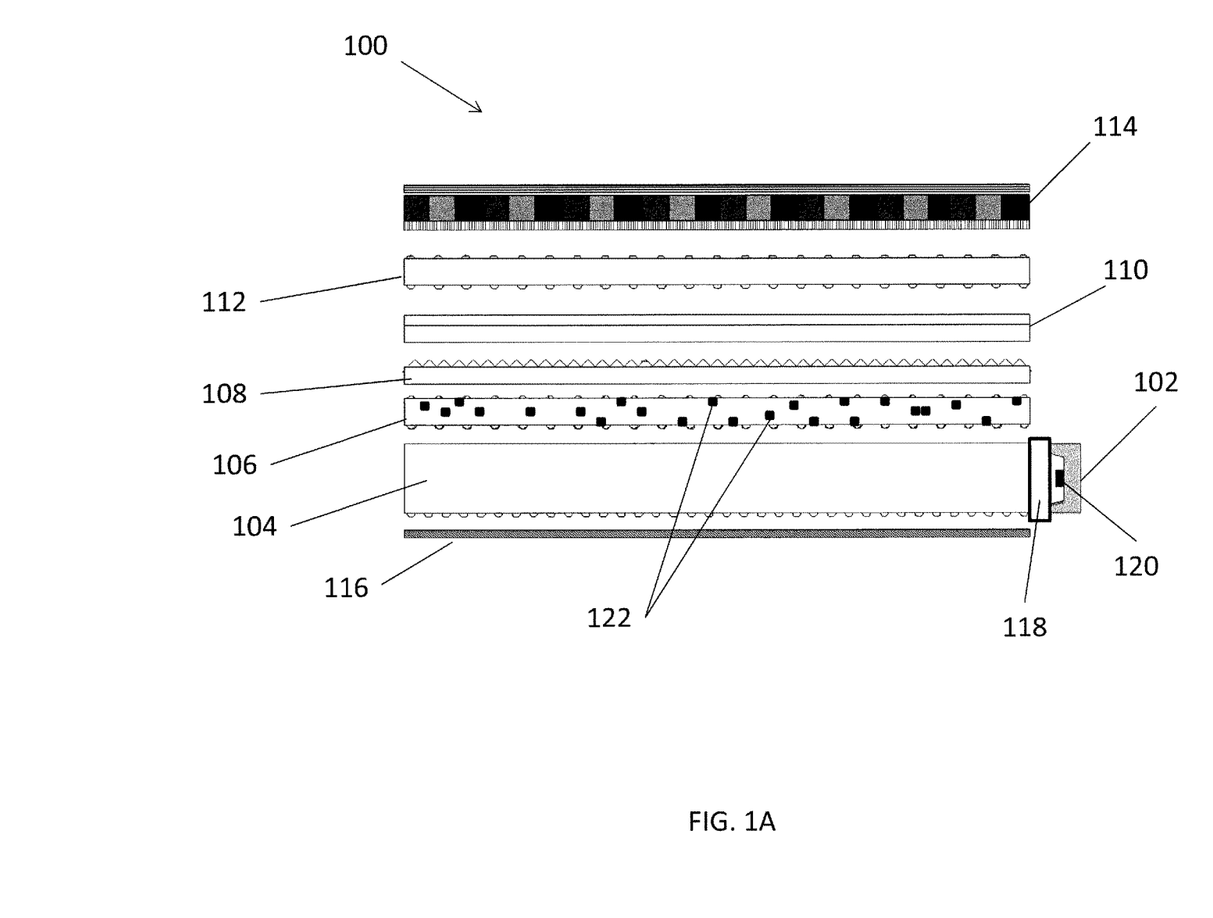
FIG. 1A shows an exemplary display system as described herein.

An exemplary display system 100 is shown in FIG. 1A. In embodiments, display system 100 comprises one or more blue light emitting diode(s) (LED) 102. Various orientations and components of LEDs are well known to those of ordinary skill in the art. Blue LEDs described herein suitably emit in the range of 440-470 nm. For example, the blue LEDs can be GaN LEDs such as a GaN LED which emits blue light at a wavelength of 450 nm.

As shown in FIG. 1A, display system 100 also comprises light guide plate 104. Suitably, light guide plate 104 is optically coupled to the one or more blue LEDs in the display systems described throughout.

As used herein the following terms are used interchangeably, "light guide plate," "light guide," or "light guide panel," and refer to an optical component that is suitable for directing electromagnetic radiation (light) from one position to another. Exemplary light guide plates include fiber optic cables, polymeric or glass solid bodies such as plates, films, containers, or other structures. The size of the light guide plate will depend on the ultimate application and characteristics of the LED. In general, the thickness of the light guide plate will be compatible with thickness of the LED. The other dimensions of the light guide plate are generally designed to extend beyond the dimensions of the LED, and are suitably on the order of 10s of millimeters, to 10s to 100s of centimeters. While the light guide plates illustrated in the Figures represent embodiments suitable for use in display systems and the like, other light guides, including fiber optic cables, etc., can also be utilized.

Suitable light guide plate materials include polycarbonate (PC), poly methyl methacrylate (PMMA), methyl methacrylate, styrene, acrylic polymer resin, glass, or any suitable light guide plate materials town in the art. Suitable manufacturing methods for the light guide plate include injection molding, extrusion, or other suitable embodiments known in the art. In exemplary embodiments, the light guide plate provides uniform primary light emission from the top surface of the light guide plate, such that primary light entering the luminescent nanocrystal film is of uniform color and brightness. The light guide plate can include any thickness or shape known in the art. For example, the light guide plate thickness can be uniform over the entire light guide plate surface. Alternatively, the light guide plate can have a wedge-like shape.

As used herein, "optically coupled" means that components (e.g., a light guide plate and an LED) are positioned so that light is able to pass from one component to another component without substantial interference. Optical coupling includes embodiments in which components such as a light guide plate and an LED are in direct physical contact, or as shown in FIG. 1A, the light guide plate 104 and the LED 102 are each in contact with an optically transparent element 118. The optically transparent element may comprise tape or adhesive, including various glues, polymeric compositions such as silicones, etc. placed between the light guide plate 104 and the LED 102 to optically couple the elements. Additional optically transparent adhesives that can be used in embodiments described herein include various polymers, including, but not limited to, poly(vinyl butyral); poly(vinyl acetate); epoxies; urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate and laurylmethacrylate; styrene based polymers; and polymers that are cross linked with difunctional monomers, such as divinylbenzene.

In further embodiments, optical coupling can be accomplished, for example, by utilising a polymeric light guide plate, that when heated, melts or deforms such that an LED can be contacted to the light guide plate, and then the light guide plate cooled, thereby facilitating the formation of a physical adhesion or contact between the two elements. In further embodiments, optical coupling can be achieved with blue LEDs that have an encapsulant protruding from the LED, for example a protruding polymer surface filled with a compliant encapsulation polymer having a refractive index similar to the refractive index of the light guide plate. In such embodiments, when the light guide plate is pressed against the blue LED, an optical coupling is formed directly between the light guide plate and the LED via the protruding encapsulant, i.e., the encapsulation polymer.

It should be noted that while optical coupling does not require physical interaction between the components, suitably physical interaction does occur, and suitably involves contact and is facilitated by an adhering composite (e.g., tape or polymer) connecting the two components. So long as light is able to pass between the components they are considered optically coupled.

Display system 100, shown in FIG. 1A, also suitably further comprises a display, for example, liquid crystal module 114. As used herein, the "display" or "display panel" of the display systems is the portion of the display output seen by the user or observer of the display systems.

Display system 100 also suitably further comprises composition 106 comprising a plurality of phosphors 122, the composition oriented between the light guide plate and the display. As described herein, in embodiments, display system 100 exhibits increased optical power output as compared to a display system where the light guide plate is not optically coupled to the blue LED.

In embodiments, the display systems described herein suitably comprise one or more additional elements traditionally found in LED-based display systems. Such elements, as shown in FIG. 1A, include, but are not limited to, one or more of diffuser(s) 112 (top or bottom), horizontal brightness enhancement film(s) (BEF) 110, vertical BEF(s) 108, and reflector(s) 116. Suitably orientations of these elements, their manufacture and incorporation in display systems are well known in the art.

Diffusers, or diffuser films, are distinct from and supplemental to the scattering features described herein. Diffusers 112 can include any diffuser film known in the art, including gain diffuser films, and can be disposed above or below the one or more BEFs 108, 110 or other optical films of the display systems In exemplary embodiments, the composition comprising phosphors (suitably a film comprising luminescent nanocrystals) eliminates the need for a conventional bottom diffuser film in the display systems, thereby minimizing the thickness of the lighting device. The compositions comprising phosphors can also include one or more scattering or diffuser features associated therewith, which can serve the purpose of traditional diffusers in addition to increasing secondary emission of the phosphors in the compositions.

The BEFs and brightness enhancing features can include reflective and/or refractive films, reflective polarizer films, prism films, groove films, grooved prism films, prisms, pitches, grooves, or any suitable BEFs or brightness enhancement features known in the art. For example, the BEFs can include conventional BEFs such as Vikuiti™. BEFs available from 3M™.

In exemplary embodiments, the display systems comprise at least one BEF, more suitably at least two BEFs. Suitably, the display systems can comprise at least three BEFs. In exemplary embodiments, at least one BEF comprises a reflective polarizer BEF, e.g., for recycling light which would otherwise be absorbed by the bottom polarizer film. The brightness-enhancing features and BEFs can include reflectors and/or refractors, polarizers, reflective polarizers, light extraction features, light recycling features, or any brightness-enhancing features known in the art. The BEFs and brightness-enhancing features can include conventional BEFs. For example, the BEFs can include a first layer having pitches or prisms having a first pitch angle, and at least a second layer having pitches or prisms having a second pitch angle.

Reflectors 116 are suitably positioned so as to increase the amount of light that is emitted from the light guide plate. Reflectors can comprise any suitable material, such as a reflective mirror, a film of reflector particles, a reflective metal film, or any suitable conventional reflectors. In embodiments, reflectors are suitably a white film. In certain embodiments, the reflectors can comprise additional functionality or features, such as scattering, diffuser, or brightness-enhancing features.

In still further embodiments, as shown in FIG. 1A, the display systems comprise one or more blue LED 102, light guide plate 104, optically coupled to blue LED 102, a display (e.g., liquid crystal module 114) and a film (e.g., 106) comprising a plurality of phosphors (122), the composition oriented between the light guide plate and the liquid crystal module. Suitably, the display systems described herein exhibit increased optical power output and luminous output as compared to a display system where the light guide plate is not optically coupled to the blue LED.

As used herein, when describing elements of the various display systems provided, "oriented between" is meant to indicate that various elements are positioned relative to one another such that one element, e.g., a composition comprising phosphors, is above one element, but below another, in a configuration in which the elements are in a stack or layered orientation. It should be understood that other orientations can be utilized in the embodiments described herein, and can be readily determined by a person of ordinary skill in the art.

Exemplary tapes and adhesives for optically coupling light guide 104 to blue LED 102 are described herein. In additional embodiments, the blue LED is coupled to the light guide via an encapsulant protruding from the LED. In addition, exemplary phosphors, including various luminescent nanocrystals are described throughout.

As described herein, in suitable embodiments, film 106 is a polymeric film, comprising luminescent nanocrystals. Exemplary polymers for use in preparing film 106, and methods of preparing polymeric films comprising luminescent nanocrystals are described herein.

Additional elements that can be included in display systems described herein are described throughout.

In an additional embodiment of display system 100, shown in FIG. 1A, described herein are display systems comprising one or more blue LED 102, a light guide plate, optically coupled to the blue LED 104, a polymeric film (e.g., 106) comprising a plurality of phosphors (122), the polymeric film oriented above the light guide plate 104, a vertical BEF 108 oriented above the polymeric film, a horizontal BEF 110 oriented above the vertical BEF 108, a top diffuser 112 oriented above the horizontal BEF 110, and a liquid crystal module 114 oriented above the top diffuser 112.

Suitably, the display systems described herein exhibit increased optical power output as compared to a display system where the light guide plate is not optically coupled to the blue LED. In embodiments, display systems described herein exhibit an optical power output of at least 26 mW/LED, more suitably at least 28 mW/LED, or at least 29 mW/LED at a driving current of 20 mA.

Exemplary methods and compositions for preparing the optical coupling are described herein, as are exemplary phosphors including luminescent nanocrystals.

The display systems described herein can comprise one or more medium materials between adjacent elements of the systems. The system can include one or more medium material disposed between any of the adjacent elements its the systems, including the LED and the light guide plate; the light guide plate and the composition comprising phosphors; between any different layers or regions within the composition comprising phosphors; the composition comprising phosphors and one or more barrier layers; the composition comprising phosphors and the light guide plate; the composition comprising phosphors and one or more BEF, diffuser; reflector, or other features; and between multiple barrier layers, or between any other elements of the display systems. The one or more media can include any suitable materials, including, but not limited to, a vacuum, air, gas, optical materials, adhesives, optical adhesives, glass, polymers, solids, liquids, gels, cured materials, optical coupling materials, index-matching or index-mismatching materials, index-gradient materials, cladding or anti-cladding materials, spacers, epoxy, silica gel, silicones, any matrix materials described herein, brightness-enhancing materials, scattering or diffuser materials, reflective or anti-reflective materials, wavelength-selective materials, wavelength-selective anti-reflective materials, color filters, or other suitable media known in the art. Suitable media materials include optically transparent, non-yellowing, pressure-sensitive optical adhesives. Suitable materials include silicones, silicone gels, silica gel, epoxies (e.g., Loctite™ Epoxy E-30CL), acrylates (e.g., 3M™ Adhesive 2175), and matrix materials mentioned herein. The one or more media materials can be applied as a curable gel or liquid and cured during or after deposition, or preformed and pre-cured prior to deposition. Suitable curing methods include UV curing, thermal curing, chemical curing, or other suitable curing methods known in the art. Suitably, index-matching media materials can be chosen to minimize optical losses between elements of the lighting device.

In additional embodiments, display systems are provided in which a container comprising a plurality of phosphors is optically coupled to a blue LED. For example, as shown in display system 160 in FIG. 1B, blue LED 162 is optically coupled at 182, to container 178 that contains a plurality of phosphors 184, for example a plurality of luminescent nanocrystals as disclosed herein. In exemplary embodiments, container 178 is a capillary, as described throughout.

Figure 1B:
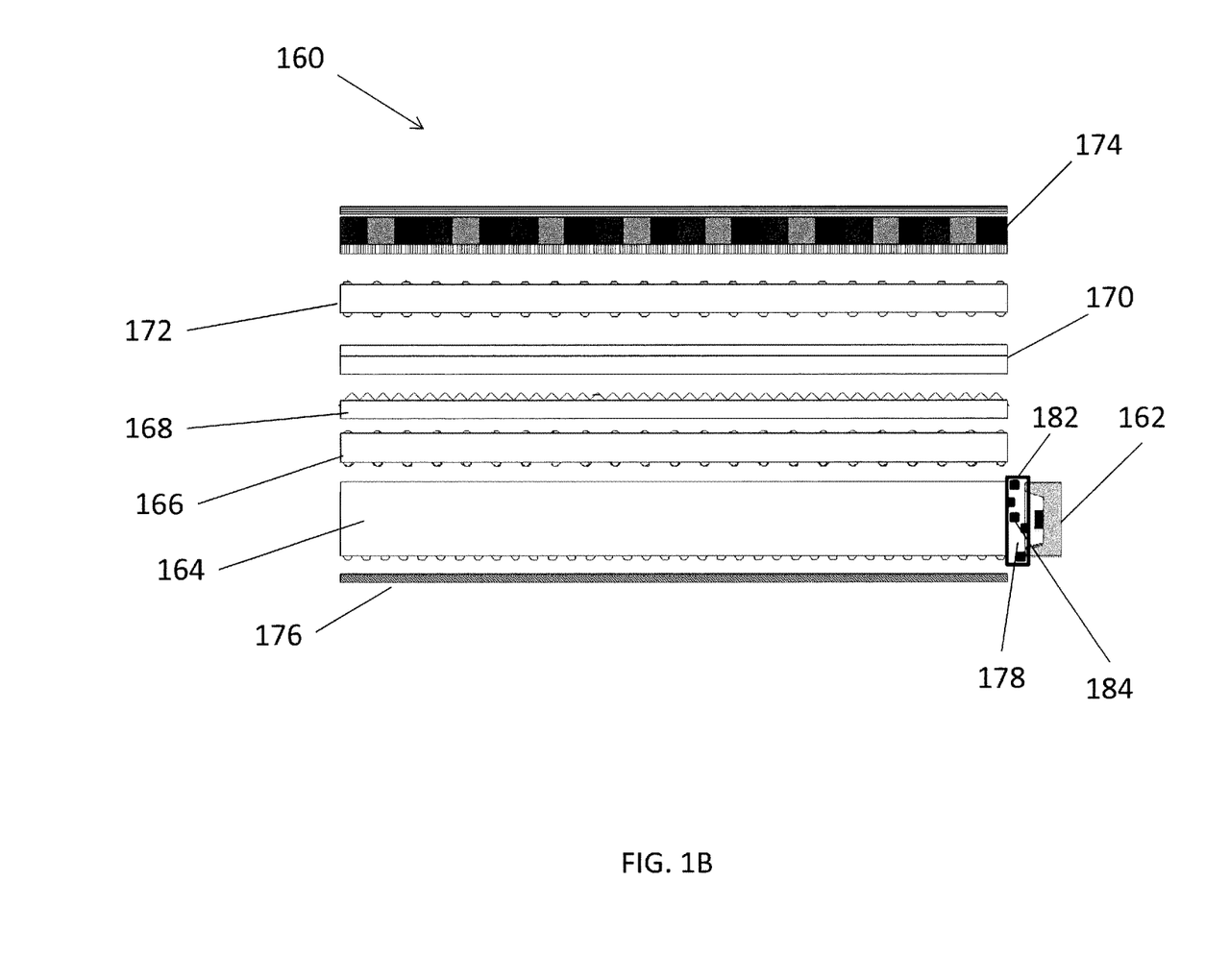
FIG. 1B shows an additional exemplary display system as described herein.

As shown in FIG. 1B, light guide plate 164 is optically coupled to container 178 at 182, via glue, mechanical alignment alone, various adhesives as described throughout, or the like, and combinations thereof. This can also be accomplished, for example, by utilizing a polymeric light guide plate, that when heated, melts or deforms such that hermetically sealed container can be contacted to the light guide plate, and then the light guide plate cooled, thereby facilitating the formation of a physical adhesion or contact between elements (e.g., between LED, light guide plate and container comprising phosphors). In additional embodiments, the blue LED is coupled to the light guide via an encapsulant protruding from the LED.

In exemplary embodiments, display systems 160 as shown, in FIG. 1B, can further comprise bottom diffuser 166 oriented above light guide plate 164, vertical BEF 168 oriented above bottom diffuser 166, horizontal BEF 170 oriented above vertical BEF 168, top diffuser 172 oriented above horizontal BEF 170, and liquid crystal module 174 (i.e., display) oriented above top diffuser 172. The display systems can also further comprise reflector 176, as described herein.

Compositions of Phosphors

As used herein, the term "phosphors" refers to a synthetic fluorescent or phosphorescent substance. Exemplary phosphors include traditional materials such as cerium(II)-doped YAG phosphors (YAG:$Ce^{3+}$, or $Y_3Al_5O_{12}$:$Ce^{3+}$), as well as luminescent nanocrystals, as described herein. Additional phosphors that can be utilized in the devices described herein include, but are not limited to, silicate phosphors, garnet phosphors, aluminate phosphors, nitride phosphors, NYAG phosphors, SiAlON phosphors and $CaAlSiN_3$-based (CASN) phosphors, as well as other phosphors known in the art.

As described throughout, compositions comprising phosphors for use in embodiments provided can take numerous shapes, including for example, films or sheets (e.g. composition 106 of FIG. 1A). In further embodiments, the compositions can be various containers or receptacles for receiving the phosphors, suitably luminescent nanocrystals.

Suitably, phosphors, and specifically luminescent nanocrystals, are dispersed or embedded in suitable polymeric materials to create films or sheets, also called quantum dot enhancement films (QDEFs). Such films are described, for example, in Published U.S. Patent Application Nos. 2010/0110728 and 2012/0113672, the disclosures of each of which are incorporated by reference herein in their entireties.

The luminescent nanocrystals are suitably coated with one or more ligand coatings, embedded in one or more films or sheets, and/or sealed by one or more barrier layers. Such ligands, films, and barriers can provide photostability to the luminescent nanocrystals and protect the luminescent nanocrystals from environmental conditions including elevated temperatures, high intensity light, external gases, moisture, and other harmful environmental conditions. Additional effects can be achieved with these materials, including a desired index of refraction in the host film material, a desired viscosity or luminescent nanocrystal dispersion/miscibility in the host film material, and other desired effects. In suitable embodiments, the ligand and film materials will be chosen to have a sufficiently low thermal expansion coefficient, such that thermal curing does not substantially affect the luminescent nanocrystal phosphor material.

The luminescent nanocrystals useful herein suitably comprise ligands conjugated to, cooperated with, associated with, or attached to their surface. In preferred embodiments, the luminescent nanocrystals include a coating layer comprising ligands to protect the luminescent nanocrystals from external moisture and oxidation, control aggregation, and allow for dispersion of the luminescent nanocrystals in the matrix material. Suitable ligands and matrix materials, as well as methods for providing such materials, are described herein. Additional suitable ligands and film materials, as well as methods for providing such materials, include any group known to those skilled in the art, including those disclosed in Published U.S. Patent Application No. 2012/0113672; U.S. patent application Ser. No. 12/79,813, filed Feb. 4, 2000; U.S. patent application Ser. No. 12/070,530, filed Mar. 19, 2008; U.S. patent application Ser. No. 12/600,736, filed Oct. 30, 2009; U.S. patent application Ser. No. 11/299,299, filed Dec. 9, 2005; U.S. Pat. Nos. 7,645,397; 7,374,807; 6,949,206; 7,572,393; and 7,267,875, the disclosure of each of which is incorporated herein by reference in its entirety. Additionally, suitable ligand and matrix materials include any suitable materials in the art.

Dispersing luminescent nanocrystals in a polymeric material provides a method to seal the nanocrystals and provide a mechanism for mixing various compositions and sizes of luminescent nanocrystals. As used throughout, "dispersed" includes uniform (i.e., substantially homogeneous) as well as non-uniform (i.e., substantially heterogeneous) distribution or placement of luminescent nanocrystals.

Suitable materials for use in the compositions comprising the luminescent nanocrystals include polymers and organic and inorganic oxides. Suitable polymers include any polymer known to the ordinarily skilled artisan that can be used for such a purpose. In suitable embodiments, the polymer will be substantially translucent or substantially transparent. Suitable matrix materials include, but are not limited to, epoxies; acrylates; norborene; polyethylene; poly(vinyl butyral):poly(vinyl acetate); polyurea; polyurethanes; silicones and silicone derivatives including, but not limited to, amino silicone (AMS), polyphenylmethylsiloxane, polyphenylalkylsiloxane. polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with difunctional monomers, such as divinylbenzene; cross-linkers suitable for cross-linking ligand materials; epoxides which combine with ligand amines (e.g., APS or PEI ligand amines) to form, epoxy, and the like.

The luminescent nanocrystals as described herein can be embedded in a polymeric (or other suitable material, e.g., waxes, oils) matrix using any suitable method, for example, mixing the luminescent nanocrystals in a polymer and casting a film; mixing the luminescent nanocrystals with monomers and polymerizing them together; mixing the luminescent nanocrystals in a sol-gel, or any other method known to those skilled in the art. As used herein, the term "embedded" is used to indicate that the luminescent nanocrystals are enclosed or encased within the polymer It should be noted that luminescent nanocrystals are suitably uniformly distributed throughout the composition, though in further embodiments they can be distributed according to an application-specific umformity distribution function.

The thickness of the compositions comprising luminescent nanocrystals as described herein can be controlled by any method known in the art, such as spin coating and screen printing. The luminescent nanocrystal compositions as described herein can be any desirable size, shape, configuration and thickness. For example, the compositions can be in the form of layers, as well as other shapes, for example, discs, spheres, cubes or blocks, tubular configurations and the like. While the various compositions can be any thickness required or desired, suitably, the compositions are on the order of about 100 mm in thickness (i.e., in one dimension), and down to on the order of less than about 1 mm in thickness. In other embodiments, the polymeric films can be on the order of 10's to 100's of microns in thickness. The luminescent nanocrystals can be embedded in the various compositions at any loading ratio that is appropriate for the desired function. Suitably, the luminescent nanocrystals will be loaded at a ratio of between about 0.001% and about 75% by volume depending upon the application, polymer and type of nanocrystals used. The appropriate loading ratios can readily be determined by the ordinarily skilled artisan and are described herein further with regard to specific applications In exemplary embodiments the amount of nanocrystals loaded in a luminescent nanocrystal composition are on the order of about 10% by volume, to parts-per-million (ppm) levels.

Containers Comprising Phosphors

In further embodiments, the compositions comprising phosphors are containers comprising a plurality of luminescent nanocrystals. As used herein, a "container" refers to a carrier, receptacle or pre-formed article into which luminescent nanocrystals are introduced (often a composition of luminescent nanocrystals, e.g., a polymeric matrix, comprising luminescent nanocrystals). Examples of containers include, but are not limited to, polymeric or glass structures such as tubes, molded or formed vessels, or receptacles. In exemplary embodiments, a container can be formed by extruding a polymeric or glass substance into a desired shape, such as a tube (circular, rectangular, triangular, oval or other desired cross-section) or similar structure. Any polymer can be used to form the containers for use in the embodiments described herein. Exemplary polymers for preparation of containers for use in the practice of the present invention include, but are not limited to, acrylics, poly(methyl methacrylate) (PMMA), and various silicone derivatives. Additional materials can also be used to form the containers for use in the practice of the present invention. For example, the containers can be prepared from metals, various glasses, ceramics and the like.

In embodiments, a polymeric or glass tube can be used as a container. A solution of luminescent nanocrystals can then be drawn into the container by simply applying a reduced pressure to an end of the container. The container can then be sealed by heating and "pinching" the container at various sealing positions or seals throughout the length of the container, or by using other sealing mechanisms as described throughout. In this way, the container can be separated into various individual sections. These sections can either be retained together as a single, sealed container, or the sections can be separated into individual pieces. Hermetic sealing of the container can be performed such that each individual seal separates solutions of the same nanocrystals. In other embodiments, seals can be created such that separate sections of the container each contain a different nanocrystal solution (i.e., different nanocrystal composition, size or density).

In embodiments, the container is suitably a plastic or glass container. In suitable embodiments, the sealed container is a plastic or glass (e.g., borosilicate) capillary. As used herein, "capillary" refers to an elongated container having a length dimension that is longer than both its width and height dimension. Suitably, a capillary is a tube or similar structure having a circular, rectangular, square, triangular, irregular, or other cross-section. Suitably, a capillary for use in the display devices described herein can be configured so as to match the shape and orientation of the LED to which it is optically coupled. In exemplary embodiments, a capillary has at least one dimension of about 100 µm to about 1 mm. In. embodiments in which a plastic capillary it utilized, a coating such as $SIO_2$, $AlO_2$ or $TiO_2$, as well as others described herein, can be added so as to provide an additional hermetic seal to the capillary.

Suitably, capillaries described herein have a thickness of about 50 µm to about 10 mm, about 100 µm to about 1 mm, or about 100 µm to about 500 µm. Thickness refers to dimension of the capillary into the plane of the light guide plate. Suitably, a capillary has a height (in the plane of the light guide plate) of about 50 µm to about 10 mm, about 100 µm: to about 1 mm, or about 100 µm to about 500 µm. Suitably, a capillary has a length (in the plane of the light guide) of about 1 mm to about 50 mm, about 1 mm to about 40 mm, about 1 mm to about 30 mm, about 1 mm to about 20 mm, or about 1 mm to about 10 mm.

The concentration of luminescent nanocrystals In the containers described herein depends on the application, size of the luminescent nanocrystals, composition of the luminescent nanocrystals, the composition of polymeric matrix in which the luminescent nanocrystals are dispersed, and other factors, and can be optimized using routine methods in the art. Suitably, the luminescent, nanocrystals. are present at a concentration of about 0.01% to about 50%, about 0.1% to about 50%, about 1% to about 50%, about 1% to about 40%, about 1% to about 30%, about 1% to about 20%, about 1% to about 10%, about 1% to about 5%, or about 1% to about 3%, by-weight.

Display Systems Exhibit Increased Optical Power Output and Increased Luminous Output As described herein and particularly in the Examples, display systems described herein exhibit increased optical power output and increased luminous output as compared to a display system where the light guide plate is not optically coupled to the blue LED. As used herein "optical power output" is defined to be the total power emitted by an LED per unit time, per LED, when driven at a constant, current. Optical power output is suitably expressed as Watts/LED (suitably mW/LED). A person of ordinary skill in the art will readily understand that optical power output cars also be calculated at various driving currents, so long as comparative measurements are appropriately made at the same driving current.

As used herein "luminous output" is defined to be the total amount of visible light emitted by a display system. Luminous output, as described herein, is measured in lumens.

As used herein "increased optical power output" when referring to the display systems described herein, is used to indicate that the display systems demonstrate greater than at least 3% more optical power as compared to a display system where the light guide plate is not optically coupled to the blue LED. More suitably, the disclosed display systems provide at least 4%, at least 5%, at least 6%, at least 7%, at least 8%, at least 9%, at least 10%, at least 11%, at least 12%, at least 13%, at least 14%, at least 15%, at least 16%, at least 17%, at least 18%, at least 19%, or at least 20% more optical power as compared to a display system where the light guide plate is not optically coupled to the blue LED. In other embodiments, the disclosed display systems demonstrate an increased optical power output of about 3% to about 20%, about 5% to about 20%, about 5% to about 15%, about 5% to about 12%, about 5% to about 11%, about 6%, to about 14%, about 7% to about 13%, about 8% to about 12%, about 9% to about 11%, about 7%, about 8%, about 9%, about 10%, about 11%, about 12%, about 13%, about 14% or about 15%, as compared to a display system where the light guide plate is not optically coupled to the blue LED, including any values and ranges within the recited values.

As used herein "increased luminous output" when referring to the display systems described herein, is used to indicate that the display systems demonstrate greater than at least 3% more luminous output as compared to a display system where the light guide plate is not optically coupled to the blue LED. More suitably, the disclosed display systems provide at least 4%, at least 5%, at least 6%, at least 7%, at least 8%, at least 9%, at least 10%, at least 11%, at least 12%, at least 13%, at least 14%, at least 15%, at least 16%, at least 17%, at least 18%, at least 19%, or at least 20% more luminous output as compared to a display system where the light guide plate is not optically coupled to the blue LED. In other embodiments, the disclosed display systems demonstrate an increased luminous output of about 3% to about 20%, about 5% to about 20%, about 5% to about 15%, about 5% to about 12%, about 5% to about 11%, about 6% to about 14%, about 7% to about 13%, about 8% to about 12%, about 9% to about 11%, about 7%, about 8%, about 9%, about 10%, about 11%, about 12%, about 13%, about 14% or about 15%, as compared to a display system where the light guide plate is not optically coupled to the blue LED, including any values and ranges within the recited values.

In further embodiments, the disclosed display systems in which a container comprising a plurality of phosphors is optically coupled to a blue LED and optically coupled to a light guide plate provide at least 4%, at least 5%, at least 6%, at least 7%, at least 8%, at least 9%, at least 10%, at. least 11%, at least 12%, at least 13%, at least 14%, at least 15%, at least 16%, at least 17%, at least 18%, at least 19%, or at least 20% more optical power as compared to a display system where a container comprising a plurality of phosphors is not optically coupled to a blue LED and is not optically coupled to a light guide plate. In other embodiments, the disclosed display systems demonstrate an increased optical power output of about 3% to about 20%, about 5% to about 20%, about 5% to about 15%, about 5% to about 12%, about 5% to about 11%, about 6% to about 14%, about 7% to about 13%, about 8% to about 12%, about 9% to about 11%, about 7%, about 8%, about 9%, about 10%, about 11%, about 12%, about 13%, about 14% or about 15%, as compared to a display system where a container comprising a plurality of phosphors is not optically coupled to a blue LED and is not optically coupled to a light guide plate, including any values and ranges within the recited values.

In further embodiments, the disclosed display systems in which a container comprising a plurality of phosphors is optically coupled to a blue LED and optically coupled to a light guide plate provide at least 4%, at least 5%, at least 6%, at least 7%, at least 8%, at least 9%, at least 10%, at least 11%, at least 12%, at least 13%, at least 14%, at least 15%, at least 16%, at least 17%, at least 18%, at least 19%, or at least 20% more luminous output as compared to a display system where a container comprising a plurality of phosphors is not optically coupled to a blue LED and is not optically coupled to a light guide plate. In other embodiments, the disclosed display systems demonstrate an increased luminous output of about 3% to about 20%, about 5% to about 20%, about 5% to about 15%, about 5% to about 12%, about 5% to about 11%, about 6% to about 14%, about 7% to about 13%, about 8% to about 12%, about 9% to about 11%, about 7%, about 8%, about 9%, about 10%, about 11%, about 12%, about 13%, about 14% or about 15%, as compared to a display system where a container comprising a plurality of phosphors is not optically coupled to a blue LED and is not optically coupled to a light guide plate, including any values and ranges within the recited values.

Methods of Increasing Optical Power Output and Luminous Output

As described herein, display systems are provided that improve blue light extraction efficiency from blue LEDs. In embodiments, the blue LEDs are optically coupled to a light guide plate. Such optical coupling removes the polymer/air interfaces, thereby suitably preventing blue light from back-reflection and subsequent absorption by the blue die (120 of FIG. 1A). Improvements in optical power output and luminous output are described throughout.

Reduction or elimination of blue light reflection brings the additional benefit of lowering the blue flux on LED package sidewalls, which extends the lifetime of the LED package. In addition, reduction of blue light absorption by the LED die can reduce the die temperature, which can further increase its efficiency and extend the LED lifetime.

In still further embodiments, methods of increasing the optical power output and luminous output of a blue LED in a display system are provided. Such methods suitably comprise optically coupling the blue LED to a light guide plate of the display system. Exemplary methods and compositions for use in optical coupling, including tape and various adhesives, are provided herein. In additional embodiments, the blue LED is coupled to the light guide via an encapsulant protruding from the LED.

As described herein, the methods suitably increase the optical power output of a blue LED in a display system by greater than at least 3% as compared to a display system where the light guide plate is not optically coupled to the blue LED. More suitably, the methods increase the optical power by at least 4%, at least 5%, at least 6%, at least 7%, at least 8%, at least 9%, at least 10%, at least 11%, at least 12%, at least 13%, at least 14%, at least 15%, at least 16%, at least 17%, at least 18%, at least 19%, or at least 20% as compared to a display system where the light guide plate is not optically coupled to the blue LED. In other embodiments, the methods described herein provide an increased optical power output of about 3% to about 20%, about 5% to about 20%, about 5% to about 15%, about 5% to about 12%, about 5% to about 11%, about 6% to about 14%, about 7% to about 13%, about 8% to about 12%, about 9% to about 11%, about 7%, about 8%, about 9%, about 10%, about 11%, about 12%, about 13%, about 14% or about 15%, as compared to a display system where the light guide plate is not optically coupled to the blue LED, including any values and ranges within the recited values.

As described herein, the methods suitably increase the luminous output of a blue LED in a display system by greater than at least 3% as compared to a display system where the light guide plate is not optically coupled to the blue LED, More suitably, the methods increase the luminous output by at least 4%, at least 5%, at least 6%, at least 7%, at least 8%, at least 9%, at least 10%, at least 11% at least 12%, at least 13%, at least 14%, at least 15%, at least 16%, at least 17%, at least 18%, at least 19%, or at least 20% as compared to a display system where the light guide plate is not optically coupled to the blue LED. In other embodiments, the methods described herein provide an increased luminous output of about 3% to about 20%, about 5% to about 20%, about 5% to about 15%, about 5% to about 12%, about 5% to about 11%, about 6% to about 14%, about 7% to about 13%, about 8% to about 12%, about 9% to about 11%, about 7%, about 8%, about 9%, about 10%, about 11%, about 12%, about 13%, about 14% or about 15%, as compared to a display system where the light guide plate is not optically coupled to the blue LED, including any values and ranges within the recited values.

It will be readily apparent to one of ordinary skill in the relevant arts that other suitable modifications and adaptations to the methods and applications described herein can be made without departing from the scope of any of the embodiments. The following examples are included herewith for purposes of illustration, only and are not intended to be limiting.

EXAMPLES

Example 1: Increased Power Output From Blue LEDs by Optical Coupling to a Light Guide Plate Generally, liquid crystal displays utilize white LEDs as the light source in the backlight. Most backlights are edge-lit—the white LEDs are placed on the edge(s) of the backlight. The white LEDs are mounted on a flex strip and placed in close proximity to a light guide plate. White light coming out of the LEDs enters the light guide plate from the edge and, through total internal reflections, is guided across the light guide plate. Extraction features are molded on the surface of the light guide plates to extract light from the light guide plate to enable a uniform distribution of light across the display. Phosphors are often introduced that offer better system efficiency and/or higher color gamut.

As described herein, luminescent nanocrystals (quantum dots) are dispersed/embedded in a polymeric film or sheet (quantum dot enhancement film (QDEF)) and placed on top of a light guide plate. White LEDs are replaced by blue LEDs (FIG. 1A). (See Published U.S. Patent Application No. 2012/0113672, the disclosure of which is incorporated by reference herein in its entirety.) When color gamut is matched at 72% National Television System Committee (NTSC), for example, luminescent nanocrystals plus blue-LEDs deliver 15-20% higher power efficiency compared to white LEDs as a result of better spectral distribution of the backlight of the QDEF that matches the color filters, which enables the use of higher transmission color filters.

Figure 2A:
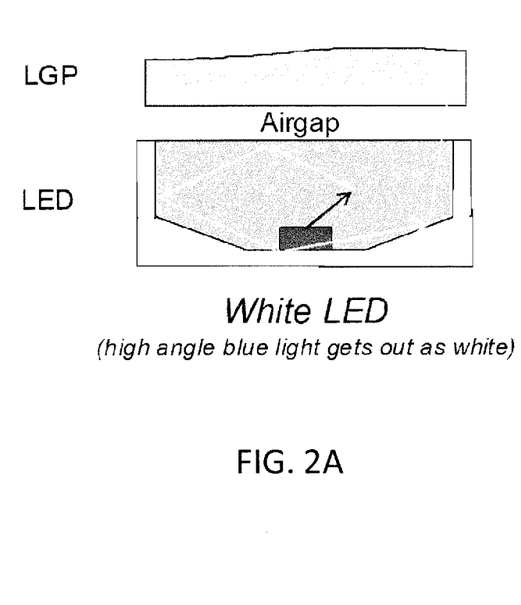
FIGS. 2A-2C show schematics illustrating the source of loss of optical power output in blue LEDs and the effect of optical coupling between an LED and a light guide plate.
Figure 2B:
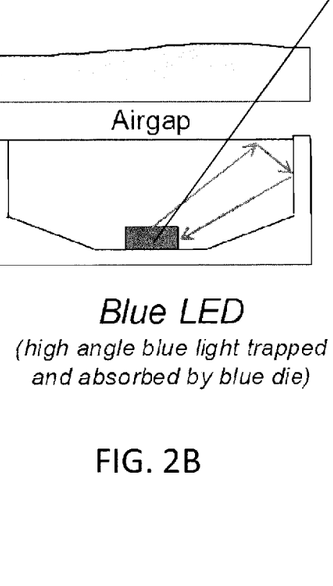
Figure 2C:
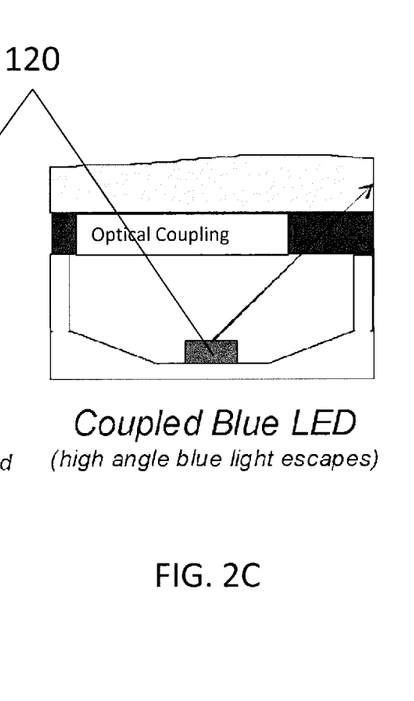

To convert from white LEDs to blue LEDs, a clear encapsulation polymer is utilized inside the LED package instead of using YAG-impregnated encapsulation polymer. Doing so, however, has an unintended consequence of lowering the out-coupling efficiency of the LED. As shown in FIGS. 2A-2C, for white LEDs (FIG. 2A), much of the blue light is converted to yellow by the YAG phosphor in the encapsulation polymer. When the yellow photons are reflected back towards the LED die, the yellow photons are not absorbed since they are below die band gap of the die material.

In the case of blue LED (FIG. 2B), in contrast, the blue photons that are reflected off the encapsulation polymer and air interface can re-enter the die 120 and can be absorbed. As a result, the blue out-coupling efficiency is lower than that of the white LED.

Figure 3A:
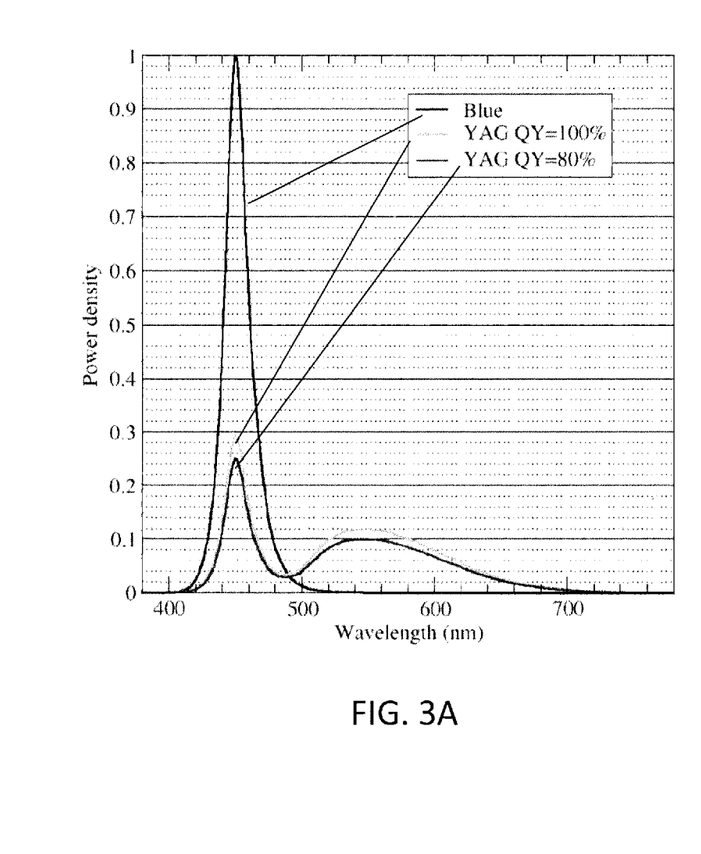
FIGS. 3A-3B show theoretical calculations of spectral power density and integrated spectral power density for blue and white LEDs.
Figure 3B:
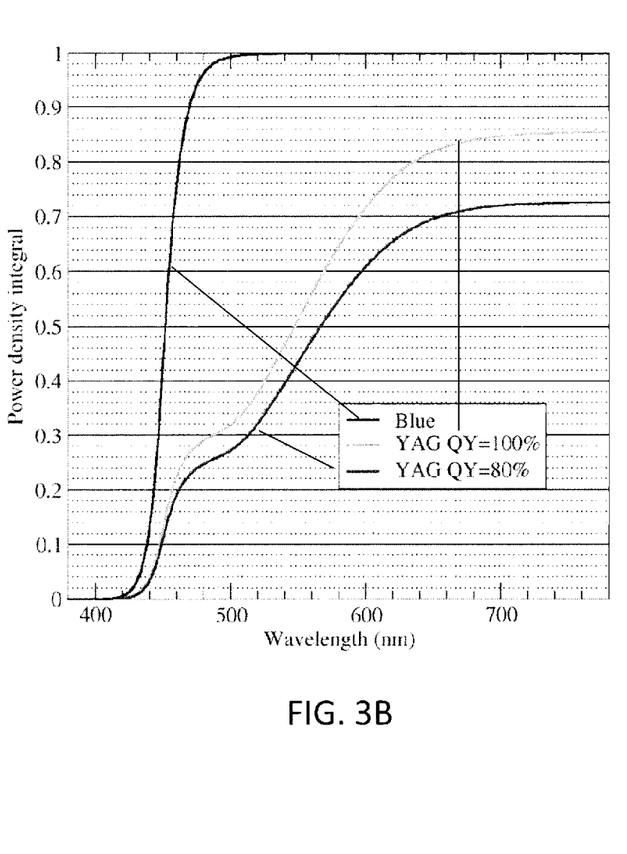

To estimate the out-coupling efficiency loss, the total optical output of a white LED and a blue LED using nominally the same efficiency blue die were determined. From theoretical calculations (FIGS. 3A-3B), if the YAG quantum efficiency is at the theoretical limit of 100%, the total optical power of a white LED should be close to 85% of a blue LED if the out-coupling efficiencies are the same in both cases. This is because the yellow photons are lower in energy (550 nm corresponds to 2.25 eV) than a blue photon (450 nm corresponds to 2.76 eV). To convert from blue to white, the majority of the blue photons (higher energy) need, to be downshifted to yellow photons (lower energy) where the energy difference is dissipated as heat. In reality, current YAG phosphor material has quantum efficiency of close to 90%. The expected power output from a white LED should be close to 80% that of the blue.

In the measurements conducted on white LEDs and blue LEDs coming from the same vendor, using the same ranked dies, and using the same packages, the surprising result was observed that the white LED power output is actually almost the same as that of the blue (Table 1).

TABLE 1

Table 1: Experimental measurements of total optical power from white LEDs and blue LEDs from the same vendor, using the same rank die, same package, and driven at the same current. Measurements were done in an integrating sphere.

|  | Integrated optical power output (mW) |
| --- | --- |
| White LED driven at 20 mA | 24.5 |
| Blue LED driven at 20 mA | 25.3 |

Similar results were obtained on LEDs from different vendors. This indicates that the light extraction efficiency from the blue LED package is significantly worse than that of the white LED package. This lower extraction efficiency is likely a result of the reflection of the blue light from the encapsulation/air interface and absorption of the blue light from the die (as shown in FIG. 2B). These results suggest that improving the out-coupling of the blue LEDs can increase the power output by close to 20%, for example up to 29-30 mW/LED or more (at a driving current of 20 mA).

To improve light extraction efficiency from blue LEDs and coupling efficiency to the light guide plate, blue LEDs are optically coupled to the light guide plate using a thin optically clear adhesive (e.g., silicone).

As illustrated in FIG. 2C, this optically clear adhesive, when index-matched to the LED encapsulation polymer and light guide plate, eliminates the reflections from two interfaces: the LED encapsulation/air interface and air/light-guide-pate interface. As a result, the blue light emitted by the blue die directly enters the light guide plate without suffering from reflection losses and absorption losses (i.e., from the blue die).

Optically coupling a white LED and a light guide plate was found to reduce brightness, likely due to the white LED's higher light extraction efficiency. See FIG. 2A. This is illustrated in the results for coupled and uncoupled brightness as demonstrated in Table 2.

TABLE 2

| White Point | (0.2891, 0.2769) | (0.2681, 0.2463) |
| --- | --- | --- |
| Brightness | 5690 nits | 4790 nits |

In the coupled case, the brightness is actually lower and the white point is cooler. The reason for this is that the blue light is able to escape the package out of the first pass when coupled to the light-guide plate. In the uncoupled case, winch is the intended use configuration, some of the blue light is reflected off the encapsulation/air interface and goes back into the package. This reflection enables more of the blue light to be absorbed by the yellow phosphors in the LED cup, which makes the white point warmer.

However, with blue LEDs, a 14% total increase in efficiency by optical coupling is demonstrated by the following set of experiments (see Table 3). A surprising and unexpected result of the embodiments described herein that has heretofore not been necessary or beneficial when using white LEDs for display systems which did not utilize films comprising luminescent nanocrystals.

In case 1, a flex strip with 25 blue LEDs is placed in an integrating sphere. When driven with 20 mA per LED, a total, optical power of 673 mW is measured. In case 2, a light guide plate (LGP) is abutted against the LED strip (as in a back light) without use of an adhesive to provide the optical coupling. The integrated optical power in case 2 is 645 mW, a 4% reduction compared to case 1 with the bare flex. This reduction is likely a result of the reflection from the air/LGP interface sending some of the blue light back towards the LED and the flex strip leading to losses. In case 3, the LEDs are optically coupled to the light guide plate using an optically clear adhesive. The total integrated blue light is 737 mW, which is 9% higher than case 1 with the bare flex and 14% higher than case 2 with the LGP uncoupled to the LEDs. In case 3, the optical power output of 29.5 mW/LED is achieved.

TABLE 3

Table 3: Measured optical power output in an integrating sphere of a flex strip with 25 blue LEDs driven at 20 mA.

|  | Power Flex/LED (mW) | Ratio to flex | Ratio to LGP w/o coupling |
| --- | --- | --- | --- |
| Flex w/o LGP | 673/26.9 | 100% |  |
| LGP w/o adhesive-based optical coupling | 645/25.8 | 96% | 100% |
| LGP w/coupling | 737/29.5 | 109% | 114% |

In order to achieve good optical coupling when the blue LEDs and the light guide plate were joined with the adhesive layer, their surfaces were prepared as follows. First, a small amount of silicone was added to the encapsulation polymer of each blue LED package. This treatment reduced the possibility of air gaps at the adhesive/LED interface. The possibility of air gaps in currently manufactured LEDs is increased due to the fact that they have concave surfaces. The possibility of air gaps would be reduced if a convex LED encapsulation surface were used and such a convex surface is preferred. Second, the edge of the light guide plate was polished to a flat surface from its original lenticular surface to enable good optical coupling with minimal air gaps. A thin strip of optically-clear adhesive was applied between the modified blue LED strip and the polished light guide plate to provide an adhesive-based optical coupling. The particular adhesive used in this experiment was a 3M optically clear adhesive 8146-x with 50 um thickness.

Figure 4A:
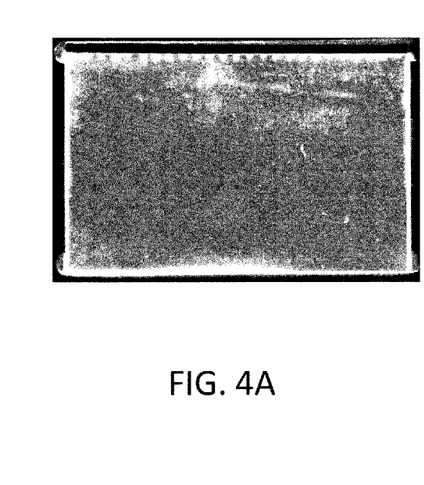
FIGS. 4A-4C show images of backlights in three different LED/optical coupling configurations.
Figure 4B:
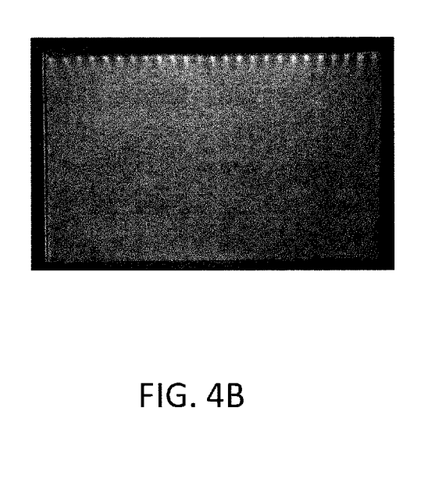
Figure 4C:
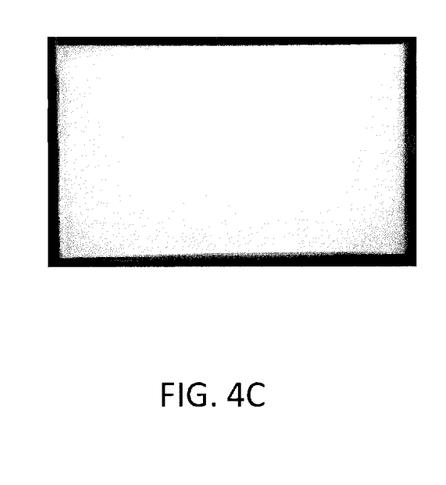

Comparison of optically-coupled and non-coupled (i.e., without adhesive coupling) configurations demonstrated that, eliminating the original lenticular surface form the edge of the light guide plate did not significantly change the light mixing distance. (See FIGS. 4A and 4B). Furthermore, the backlight appeared homogeneous without any noticeable streaks close to the LEDs in a fully assembled backlight assembly that included QDEF and horizontal and vertical BEFs placed on top of the light guide plate, (FIG. 4C).

By combining the benefits of a high-efficiency QDEF and better out-coupled blue LEDs, the next generation LCD backlights can enable >30% energy savings compared to the current generation LCDs at the same color gamut, e.g., sRGB. Even for high color gamut displays, e.g., Adobe-RGB and DCI-P3, higher efficiency LCDs can be achieved compared to today's sRGB LCDs. In addition to other benefits, such increases can enable the use of smaller batteries in various mobile devices.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

What is claimed is:

1. A method of providing a display system, the method comprising:
    disposing an optically clear material between one or more blue light emitting diodes (LEDs) and a light guide plate to eliminate an air gap between the one or more blue LEDs and the light guide plate, and to optically couple the one or more blue LEDs to the light guide plate, the optically clear material having a refractive index matched to the light guide plate to reduce optical losses of light passing between the one or more blue LEDs and the light guide plate during operation;
    providing a display panel, such that light provided by the one or more blue LEDs associated with the display system can pass through the optically clear material and the light guide plate to the display panel; and
    disposing a composition comprising a plurality of nanocrystal phosphors oriented between the light guide plate and the display panel;
    wherein, when light is provided from the one or more blue LEDs through the optically clear material and the light guide plate, the display system exhibits increased optical power output due at least in part to the elimination of the air gap by the optically clear material.

2. The method of claim 1, wherein the disposing the composition comprises disposing luminescent nanocrystal phosphors.

3. The method of claim 1, wherein the disposing the composition between the light guide plate and the display panel comprises disposing a film between the light guide plate and the display panel.

4. The method of claim 1, wherein the providing the display panel comprises providing a liquid crystal module.

5. The method of claim 1, wherein the disposing the optically clear material between the one or more blue LEDs and the light guide plate comprises disposing at least one of a tape, an adhesive, or an encapsulant protruding from the blue LED between the one or more blue LEDs and the light guide plate.

6. The method of claim 1, further comprising providing at least one of a diffuser, a brightness enhancement film (BEF) or a reflector in the display system.

7. The method of claim 1, wherein, when light is provided from the one or more blue LEDs through the optically clear material and the light guide plate, the display system exhibits at least a 10% increase in optical power output.

8. The method of claim 1, wherein, when light is provided from the one or more blue LEDs through the optically clear material and the light guide plate, the display system exhibits increased luminous output due at least in part to the elimination of the air gap by the optically clear material.

9. The method of claim 1, further comprising providing the one or more blue LEDs, the one or more blue LEDs having a clear encapsulation polymer.

10. The method of claim 2, wherein the disposing the luminescent nanocrystal phosphors comprises disposing CdSe or ZnS luminescent nanocrystal phosphors.

11. The method of claim 10, wherein the disposing the CdSe or ZnS luminescent nanocrystal phosphors comprises disposing CdSe/ZnS, InP/ZnS, InP/ZnSe, PbSe/PbS, CdSe/CdS, CdTe/CdS or CdTe/ZnS luminescent nanocrystal phosphors.

12. A method of providing a display system, the method comprising:
    providing a light source, the light source comprising one or more blue light emitting diodes (LEDs) having a clear encapsulation polymer;
    disposing an optically clear material between the light source and a light guide plate to eliminate an air gap between the light source and the light guide plate, and to optically couple the light source to the light guide plate, the optically clear material having a refractive index matched to the light guide plate to reduce optical losses of light passing between the light source and the light guide plate during operation;
    providing a display panel, such that light provided by the light source associated with the display system can pass through the optically clear material and the light guide plate to the display panel; and
    providing a composition comprising a plurality of nanocrystal phosphors, the composition oriented between the light guide plate and the display panel;
    wherein, when light is provided from the light source through the optically clear material and the light guide plate, the display system exhibits increased optical power output due at least in part to the elimination of the air gap by the optically clear material.

13. The method of claim 12, wherein the disposing the composition comprises disposing luminescent nanocrystal phosphors.

14. The method of claim 12, wherein the disposing the composition between the light guide plate and the display panel comprises disposing a film between the light guide plate and the display panel.

15. The method of claim 12, wherein the providing the display panel comprises providing a liquid crystal module.

16. The method of claim 13, wherein the disposing the luminescent nanocrystal phosphors comprises disposing CdSe or ZnS luminescent nanocrystal phosphors.

17. The method of claim 16, wherein the disposing the CdSe or ZnS luminescent nanocrystal phosphors comprises disposing CdSe/ZnS, InP/ZnS, InP/ZnSe, PbSe/PbS, CdSe/CdS, CdTe/CdS or CdTe/ZnS luminescent nanocrystal phosphors.

* * * * *